United States Patent [19]

Hoover

[11] Patent Number: 4,559,476
[45] Date of Patent: Dec. 17, 1985

[54] RADIO-FREQUENCY AMPLIFIER

[75] Inventor: Merle V. Hoover, Raritan Township, Hunterdon County, N.J.

[73] Assignee: RCA Corporation, Princeton, N.J.

[21] Appl. No.: 536,086

[22] Filed: Sep. 27, 1983

[51] Int. Cl.$^4$ .......................... H01J 7/46; H01J 19/18
[52] U.S. Cl. ........................................ 315/39; 330/55; 331/100; 331/102; 315/5.16
[58] Field of Search .................... 315/5.14, 5.16, 5.28, 315/39; 330/55; 331/102, 100

[56] References Cited

U.S. PATENT DOCUMENTS

| 2,153,728 | 4/1939 | Southworth | 315/39 |
| 2,404,363 | 7/1946 | Chevigny | 250/27.5 |
| 2,413,309 | 12/1946 | Benioff | 250/27.5 |
| 2,541,026 | 2/1951 | Boddie | 315/39 |
| 2,591,963 | 4/1952 | Nergaard | 315/5 |
| 2,840,647 | 6/1958 | Koros et al. | 179/171 |
| 3,215,886 | 11/1965 | Helwig | 313/313 |

OTHER PUBLICATIONS

M. V. Hoover–"Advances in the Techniques and Application of Very–High–Power Grid–Controlled Tubes", *The Proceedings of the Institution of Electrical Engineers*, vol. 105, Part B Suppl. No. 10, 1958, p. 550.

*Primary Examiner*—David K. Moore
*Assistant Examiner*—William L. Oen
*Attorney, Agent, or Firm*—Eugene M. Whitacre; Dennis H. Irlbeck; Vincent J. Coughlin, Jr.

[57] ABSTRACT

A radio-frequency amplifier includes at least two double-ended electron discharge devices in coaxial-type, radio-frequency cavity-resonator circuits. Each discharge device has a discharge region so that the amplifier comprises a plurality of longitudinally spaced-apart, electrically connected discharge regions. Each of the discharge regions has a cathode with an anode circumscribing the cathode. At least one grid electrode is disposed between the cathode and the anode. A coaxial input transmission line is loop-coupled to an input cavity-resonator circuit and a coaxial output transmission line is loop-coupled to an output cavity-resonator circuit.

7 Claims, 4 Drawing Figures

RADIO-FREQUENCY AMPLIFIER

BACKGROUND OF THE INVENTION

The invention relates to a radio-frequency amplifier and more particularly to a plurality of double-ended, grid-controlled electron discharge devices in coaxial-type, radio-frequency cavity-resonator circuits that can be used in television broadcasting, particle accelerators, industrial heating and communications transmitters.

L. S. Nergaard U.S. Pat. No. 2,591,963 on Apr. 8, 1952 discloses a double-ended grid-controlled electron discharge device (triode vacuum tube) and associated coaxial-type, radio-frequency cavity resonators for the input (cathode-grid) and output (grid-anode) circuits. The Nergaard patent discloses a structure having a single electron discharge region. The power handling and high frequency capabilities of grid-controlled tubes are greatly extended by the use of the double-ended configuration instead of the single-ended configuration commonly used in conjunction with large power tubes. As disclosed in Hoover "Advances In The Techniques And Applications Of Very-High-Power Grid-Controlled Tubes", *The Proceedings of the Institution of Electrical Engineers,* Vol. 105 Part B Suppl. No. 10, 550–558 (1958), a double-ended tube and circuit is, in essence, two single-ended tube-circuit combinations joined at the voltage antinodes of the respective coaxial radio-frequency resonator circuits. The Nergaard patent and the Hoover article are incorporated by reference herein for the purpose of disclosure. A prior art single-ended tube and circuit is shown in FIG. 1. As shown in FIG. 1, the antinode of maximum r.f. standing-wave voltage, V, appears across the tube electrodes at the closed, upper end of the tube, which is outside the electron discharge region of the tube. The electron discharge region, hereinafter called the discharge region, of a tube is the cylindrically disposed portion extending longitudinally along the electron active length of the tube electrodes.

As shown in FIG. 2, a conventional double-ended triode power tube and circuit has an antinode, V, centered within the discharge region for optimum performance. Such a configuration is currently used in super-power tubes and circuits to obtain maximum power, bandwidth, gain and efficiency for ultra-high-frequency operation. As can be seen from FIG. 2, the double-ended triode configuration comprises a cathode, a grid electrode and an anode generally arranged in the form of progressively larger concentric cylinders. The grid electrode contains suitable apertures through which electrons traverse in flowing from the cathode to the anode. A double-ended power tube and cavity-resonator circuit configuration is described in detail in Koros et al. U.S. Pat. No. 2,840,647 on June 24, 1958 and incorporated by reference herein for the purpose of disclosure. The double-ended configuration doubles the length of the discharge region of the tube to permit the generation of at least twice the r.f. power output of a single-ended tube. Typically, the discharge region, extending from $V_1$ to $V_2$ in FIG. 2, should not exceed 60 degrees of electrical length at the operating frequency; otherwise, the operational power conversion efficiency of the tube and cavity circuit is degraded because the instantaneous standing-wave of r.f. voltage is progressively lower at both extremities of the triode-electrode region. This fundamental restriction is one of the limitations which determines the maximum theoretical power generating capability of a conventional double-ended tube and cavity circuit. When even greater amounts of r.f. power are required, it is common practice to use special power-combining circuits (e.g. diplexers) to sum the outputs from two or more tube-cavity combinations into a common load. However, the use of such power-combining circuits is disadvantageous from the standpoint of size, power-loss, mechanical-electrical complexity, and cost.

It is therefore desirable to provide a compact and efficient structure for generating large amounts of r.f. power without the use of special power-combining circuits.

SUMMARY OF THE INVENTION

A radio-frequency amplifier has at least two double-ended electron discharge devices in a first and a second coaxial cavity-resonator circuit, each of said discharge devices has a discharge region so that said amplifier comprises a plurality of longitudinally spaced apart, electrically connected discharge regions. Each of said discharge devices has a cathode with an anode circumscribing said cathode. At least one grid electrode is disposed between the cathode and the anode. Input means are coupled to drive said first cavity-resonator circuit and output means are coupled to said second cavity-resonator circuit for extracting an output therefrom.

DETAILED DESCRIPTION OF THE PREFERRED EMBODIMENTS

Figure 3:
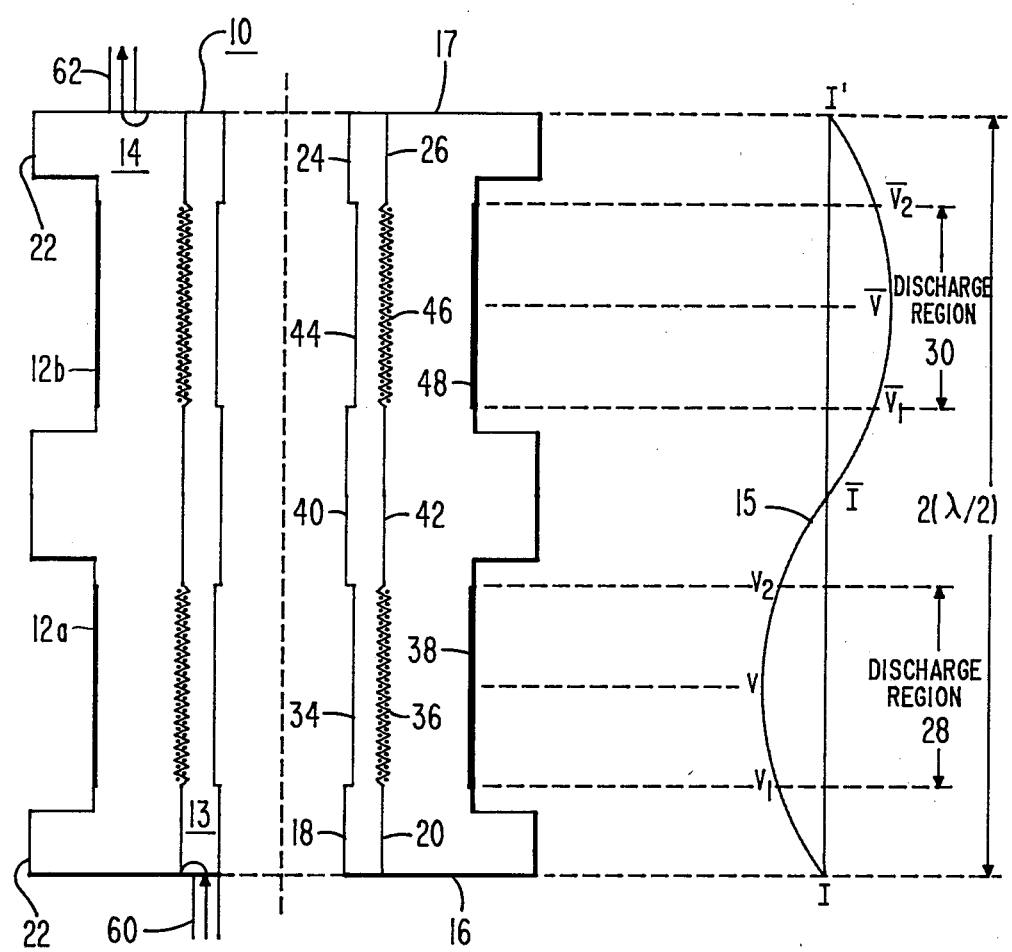
FIG. 3 illustrates diagrammatically and by symbols a longitudinal cross-section of a novel radio-frequency amplifier having two longitudinally spaced apart, electrically connected discharge regions in accordance with the present invention.

Referring to FIG. 3, there is illustrated diagrammatically and by means of symbols a longitudinal cross-section of a cathode-driven (grounded-grid) radio-frequency amplifier 10 comprising two double-ended triode electron discharge devices 12a and 12b in coaxial-type, radio-frequency cavity resonator circuits 13 and 14. The longitudinal electrical-length of the amplifier 10 is one wavelength ($2\lambda/2$) at the operating frequency with a longitudinal standing-wave voltage, depicted by waveform 15, established in both the first (input) and the second (output) cavity-resonator circuits 13 and 14, respectively.

The amplifier 10 includes a lower end 16 and an upper end 17. The lower end 16 comprises a lower cathode contact ring 18, a lower grid electrode contact ring 20 and an anode cylinder 22. The upper end 17 comprises an upper cathode contact ring 24 and an upper grid electrode contact ring 26. The anode cylinder 22 forms a portion of the vacuum envelope (not shown) of the devices 12a and 12b, and comprises a metallic structure common to the ends 16 and 17, respectively. The various contact rings are electrically separated by insulating means (not shown), such as grid-anode voltage-blocking capacitors, which are well known in the art.

Enclosed within the discharge devices 12a and 12b are first and second longitudinally spaced apart discharge regions 28 and 30, respectively. The discharge devices contain the elements necessary for the generation of radio-frequency power.

The first discharge region 28 within discharge device 12a includes a first cathode 34, a first grid electrode 36, and a first anode 38 which comprises an internal portion of the anode cylinder 22. The aforementioned elements are generally arranged in the form of progressively larger concentric cylinders. The first discharge region 28 extends longitudinally between points $V_1$ and $V_2$ of the r.f. voltage waveform 15 and, typically, should not exceed about 60 degrees of electrical length at the operating frequency. The first cathode 34 is electrically connected at one end to the lower cathode contact ring 18 and at the other end to an intermediate cathode contact ring 40. The first grid electrode 36 is connected at one end to the lower grid electrode contact ring 20 and at the other end to an intermediate grid electrode contact ring 42.

The second discharge region 30 within discharge device 12b includes a second cathode 44, a second grid electrode 46, and a second anode 48 which comprises an internal portion of the anode cylinder 22. The aforementioned elements are generally arranged in the form of progressively larger concentric cylinders. The second discharge region 30 extends longitudinally between points $\overline{V}_1$ and $\overline{V}_2$ of the r.f. voltage waveform 15 and, typically, should not exceed about 60 degrees of electrical length at the operating frequency. The second cathode 44 is electrically connected at one end to the intermediate cathode contact ring 40 and at the other end to the upper cathode contact ring 24. The second grid electrode 46 is connected at one end to the intermediate grid electrode contact ring 42 and at the other end to the upper grid contact ring 26.

The cathodes 34 and 44 are of the indirectly-heated, oxide-type well known in the art, in which case a cathode filament (not shown) is disposed within the cathode cylinders to heat the cathodes to emission temperature. Alternatively, the cathode 34 and 44 may be directly heated elements, such as those shown and described in the above-referenced Hoover article.

The cathode-grid r.f. driving-voltage for the cathode-driven (grounded-grid) amplifier 10 is provided over a coaxial input transmission line 60 having inner and outer conductors which is loop-coupled to drive the enclosed input cavity-resonator circuit 13 comprising the first cathode 34, the second cathode 44, the first grid electrode 36 and the second grid electrode 46. The dimensions of the enclosed volume of the input circuit 13 are chosen such that the cavity is resonant at the operating frequency in the longitudinal one wavelength ($2 \lambda/2$) mode, thereby establishing the standing wave of r.f. voltage 15. As shown in FIG. 3, the cathode-to-grid drive-voltage in the lower triode section is an increment of the standing-wave of maximum voltage centered on V in waveform 15, while the cathode-to-grid driving-voltage in the upper triode section is an increment of the standing-wave of maximum voltage centered on $\overline{V}$ in waveform 15; there is a 180 degree phase-differential between the voltage-maxima V and $\overline{V}$.

The output cavity-resonator circuit 14 for the amplifier 10 comprises the first grid electrode 36, the second grid electrode 46, the first anode 38 and the second anode 48. The dimensions of the enclosed volume for the output circuit 14 are chosen such that the cavity is also resonant in the longitudinal one wavelength ($2 \lambda/2$) mode at the operating frequency, thereby establishing the standing-wave of r.f. voltage 15. The r.f. power output is loop-coupled from the output cavity-resonator circuit 14 to a coaxial output transmission line 62 having inner and outer conductors.

Figure 4:
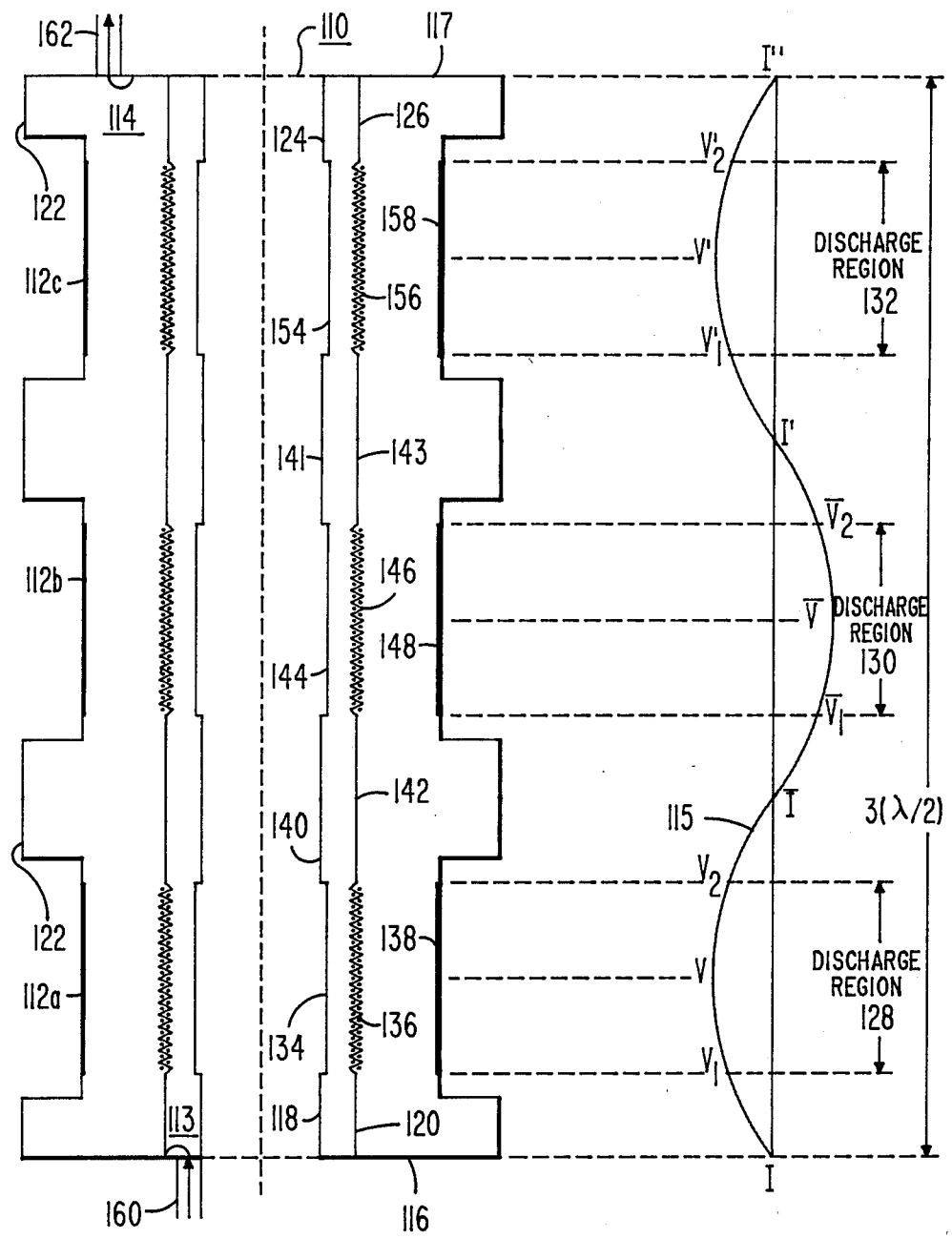
FIG. 4 illustrates diagrammatically and by symbols a longitudinal cross-section of a novel radio-frequency amplifier having three longitudinally spaced apart, electrically connected discharge regions in accordance with the present invention.

An alternative embodiment of the present invention is illustrated diagrammatically and by means of symbols in FIG. 4, wherein a longitudinal cross-section of a radio-frequency amplifier 110 comprising three double-ended triode electron discharge devices 112a, 112b and 112c in coaxial-type, radio-frequency cavity-resonator circuits 113 and 114. The longitudinal electrical-length of the amplifier 110 is one and one half ($3\lambda/2$) wavelengths at the operating frequency, with a longitudinal standing-wave voltage, depicted by waveform 115, established in both the first (input) and the second (output) cavity-resonator circuits 113 and 114, respectively.

The amplifier 110 includes a lower end 116 and an upper end 117. The lower end 116 comprises a lower cathode contact ring 118, a lower grid electrode contact ring 120 and an anode cylinder 122. The upper end 117 comprises an upper cathode contact ring 124 and an upper grid electrode contact ring 126. The anode cylinder 122 forms a portion of the vacuum envelope of the discharge devices 112a, 112b and 112c, and comprises a metallic structure common to the ends 116 and 117, respectively. The various contact rings are electrically separated by insulating means (not shown), such as grid-anode blocking capacitors, which are well known in the art.

Enclosed within the discharge devices 112a, 112b and 112c are three longitudinally spaced apart, discharge regions 128, 130 and 132, respectively. The discharge devices contain the elements necessary for the generation of radio-frequency power. The discharge regions, typically, should not exceed about 60 degrees of electrical length at the operating frequency.

The first discharge region 128 within discharge device 112a includes a first cathode 134, a first grid electrode 136 and a first anode 138 which comprises an internal portion of the anode cylinder 122. The aformentioned elements are generally arranged in the form of progressively larger cylinders. The first region 128 extends longitudinally between points $V_1$ and $V_2$ of the r.f. voltage waveform 115. The first cathode 134 is electrically connected at one end to the lower cathode contact ring 118 and at the other end to a lower intermediate cathode contact ring 140. The first grid electrode 136 is connected at one end to the lower grid electrode contact ring 120 and at the other end to a lower intermediate grid electrode contact ring 142.

The second discharge region 130 within discharge device 112b includes a second cathode 144, a second grid electrode 146 and a second anode 148 which comprises an internal portion of the anode cylinder 122. The second region 130 extends longitudinally between points $V_1$ and $V_2$ of the r.f. voltage waveform 115. The second cathode 144 is electrically connected at one end to the lower intermediate cathode contact ring 140 and at the other end to an upper intermediate cathode contact ring 141. The second grid electrode 146 is connected at one end to the lower intermediate grid electrode contact ring 142 and at the other end to an upper intermediate grid electrode contact ring 143.

The third discharge region 132 within discharge device 112c includes a third cathode 154, a third grid electrode 156 and a third anode 158 which comprises an internal portion of the anode cylinder 122. The third region 132 extends longitudinally between points $V_1'$ and $V_2'$ of the r.f. voltage waveform 115. The third cathode 154 is electrically connected at one end to the upper intermediate cathode contact ring 141 and at the other end to the upper cathode contact ring 124. The third grid electrode 156 is electrically connected at one end to the upper intermediate grid contact ring 143 and at the other end to the upper grid contact ring 126.

The cathode-grid r.f. driving-voltage for the amplifier 110 is provided over a coaxial input transmission line 160 having inner and outer conductors which is looped-coupled to drive the enclosed input cavity-resonator circuit 113 comprising the cathodes 134, 144 and 154 and the grid electrodes 136, 146 and 156. The dimensions of the enclosed volume of the input circuit 113 are chosen such that the cavity is resonant at the operating frequency in the longitudinal one and one-half wavelength $(3\lambda/2)$ mode, thereby establishing the standing-wave of r.f. voltage 115. As shown in FIG. 4, the cathode-to-grid driving-voltage in the lower triode section is an increment of the standing-wave of maximum voltage centered on V, while the upper triode section is driven by a voltage-increment centered about voltage-maximum V'. It can be seen that corresponding points on the waveform 115 in the upper and lower triode sections operate at mutually similar instantaneous phasing, while corresponding points on waveform 115 in the middle triode section, which is driven by an increment of voltage centered about voltage-maximum $\overline{V}$, operate with a 180 degree phase-differential with respect to the corresponding points in the upper and lower triode sections.

The output cavity-resonator circuit 114 for the amplifier 110 includes the grid electrodes 136, 146 and 156 and the anodes 138, 148 and 158. The dimensions of the enclosed volume for the output circuit 114 are chosen such that the cavity is also resonant in the longitudinal one and one-half wavelength $(3\lambda/2)$ mode at the operating frequency, thereby establishing the standing-wave of r.f. voltage 115. The output power is loop-coupled from the output cavity-resonator to a coaxial output transmission line 162 having inner and outer conductors.

While the above-described embodiments relate to double-ended triode structures, the invention is not limited to such structures and may be incorporated into double-ended tetrodes, for example. In such a case, a screen grid electrode and suitable contact rings would be located between the (control) grid electrode and the anode. The input cavity-resonator circuit would then comprise the cathodes and the (control) grid electrodes as in FIGS. 3 and 4; however, the output cavity-resonator circuit would comprise the screen grid electrodes and the anodes.

THEORY OF OPERATION

Figure 1:
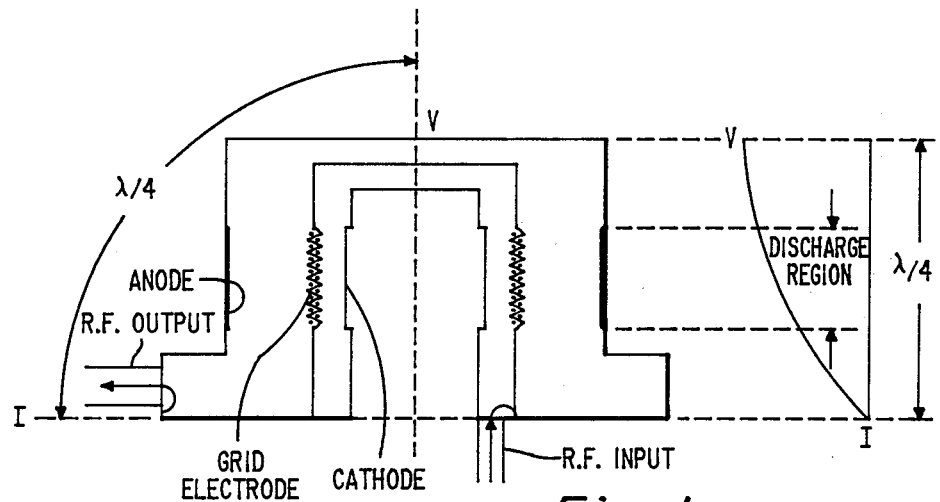
FIG. 1 illustrates diagrammatically and by symbols a longitudinal cross-section of a conventional single-ended triode power tube and circuit.
Figure 2:
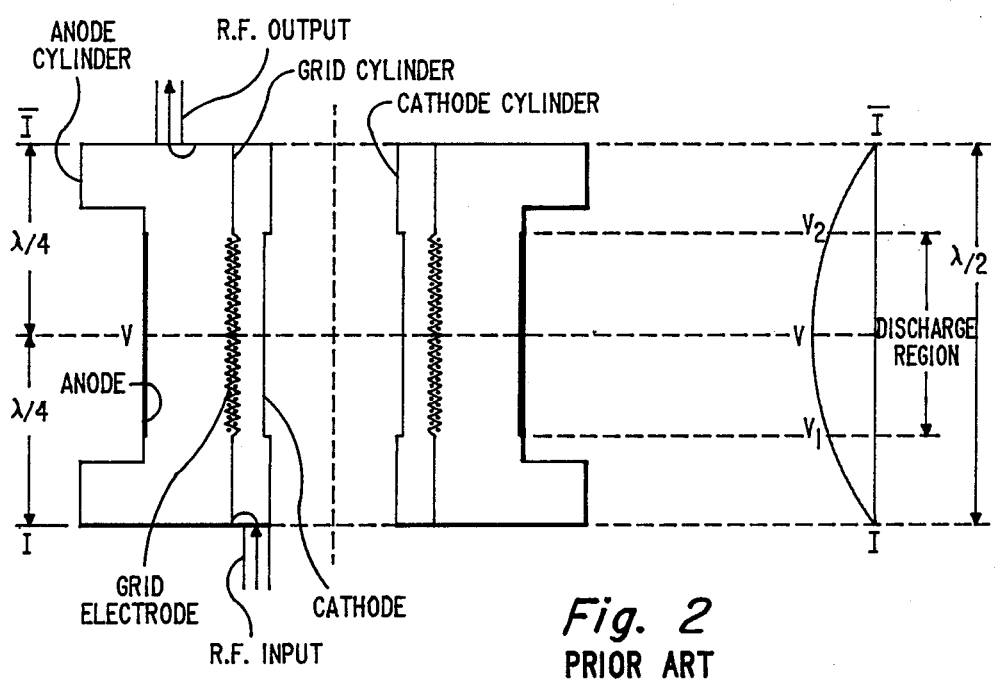
FIG. 2 illustrates diagrammatically and by symbols a longitudinal cross-section of a conventional double-ended power tube and circuit.

By comparing the prior art structure of FIG. 2, having a single electron discharge region, to the novel structure of FIG. 3, having two longitudinally spaced apart, electrically connected discharge regions, it can be seen that when the dimension determined for the discharge region, $V_1$ to $V_2$, in FIG. 2 is the maximum optimum length at a particular operating frequency, and when the dimensions of the discharge regions $V_1$ to $V_2$ and $\overline{V}_1$ to $\overline{V}_2$ in FIG. 3 are each equal to the $V_1$ to $V_2$ dimension of FIG. 2, then the novel structure of FIG. 3 can provide twice as much power as the single discharge region structure of FIG. 2. Thus, the invention permits the generation of the same amount of power from a single amplifier having two electron discharge devices and circuits having longitudinally spaced apart, electrically connected discharge regions as would be obtained from two separate amplifiers, each having a single double-ended type of electron discharge device and using external power combining structures such as a diplexer. As shown in FIG. 4, the number of discharge regions is not limited to two, and by the inclusion of a third discharge region, by the addition of a third discharge device, the power output can be increased by an additional 50 percent over that of the structure of FIG. 3 without resorting to the use of auxiliary power combining devices such as, e.g., diplexers.

Those skilled in the art will be cognizant of numerous alternative embodiments of the novel structures illustrated herein. For example, with reference to FIGS. 3 and 4, the simple coaxial lines 62 and 162 would be unsuited for use in conjunction with output cavity-resonator circuits 14 and 114, respectively, when the cavity-resonators are used to generate large amounts of r.f. power. In such applications, a large diameter coaxial line would be arranged on upper ends 17 and 117, as is known in the art.

While the invention was described as being embodied in an r.f. amplifier, it is clear to one skilled in the art that with proper feedback means from output to input, the invention may also be embodied in an r.f. oscillator.

What is claimed is:

1. A radio-frequency amplifier having at least two double-ended; mechanically serially connected electron discharge devices in a first and a second coaxial cavity-resonator circuit, each of said discharge devices having a discharge region so that said amplifier comprises a plurality of longitudinally spaced apart, electrically connected discharge regions, each of said discharge devices having a cathode, an anode circumscribing said cathode, and at least one grid electrode disposed between said cathode and said anode, input means coupled to drive said first cavity-resonator circuit, and output means coupled to said second cavity-resonator circuit for extracting an output therefrom.

2. The amplifier as in claim 1, wherein each of said discharge regions has an electrical length of about 60 degrees at the operating frequency.

3. The amplifier as in claim 1, wherein said first-cavity-resonator circuit includes said cathode and said grid electrode of each of said discharge devices.

4. The amplifier as in claim 1, wherein said second cavity-resonator circuit includes said grid electrode and said anode of each of said discharge devices.

5. A radio-frequency amplifier having at least two double-ended mechanically serially connected electron discharge devices in a first and a second coaxial cavity-resonator circuit, each of said cavity-resonator circuits having therein established a longitudinal radio-frequency standing-wave electrical length of at least two half-wavelength at the operating frequency, each of said discharge devices having a discharge region so that said amplifier comprises a plurality of longitudinally spaced apart, electrically connected discharge regions, each of said discharge regions having a substantially cylindrical cathode, an anode circumscribing said cathode, and a grid electrode disposed between said cathode and said anode, an input transmission line coupled to said first cavity-resonator circuit comprising said cathode and said grid electrode of each of said discharge devices, and an output transmission line coupled to said second cavity-resonator circuit comprising said grid electrode and said anode of each of said discharge devices.

6. The amplifier as in claim 5, wherein each of said discharge regions has an electrical length of about 60 degrees at the operating frequency.

7. A radio-frequency amplifier including at least two double-ended mechanically serially connected electron discharge devices in a first and a second coaxial cavity-resonator circuit, each of said cavity-resonator circuits having therein established a longitudinal radio-frequency standing-wave electrical length of at least two half-wavelengths at the operating frequency, each of said discharge devices having a discharge region so that said amplifier comprises a plurality of longitudinally spaced apart, electrically connected discharge regions, each of said discharge regions being centered on a standing-wave voltage maximum and having an electrical length of about 60 degrees at the operating frequency, each of said discharge regions including a cathode, a grid electrode and an anode generally arranged in the form of progressively larger concentric cylinders, an input transmission line having inner and outer conductors coupled to said first cavity-resonator circuit comprising said cathode and said grid electrode of each of said discharge devices, and an output transmission line having inner and outer conductors coupled to said second cavity-resonator circuit comprising said grid electrode and said anode of each of said discharge devices.

* * * * *

UNITED STATES PATENT AND TRADEMARK OFFICE
CERTIFICATE OF CORRECTION

PATENT NO. : 4,559,476

DATED : December 17, 1985

INVENTOR(S) : Merle Vincent Hoover

It is certified that error appears in the above-identified patent and that said Letters Patent is hereby corrected as shown below:

Column 4, Line 66 — "$V_1$ and $V_2$" should be -- $\overline{V}_1$ and $\overline{V}_2$ -- ; and Column 6, Line 40 — "double-ended; mechanically" should be -- double-ended mechanically -- .

Signed and Sealed this

Twenty-ninth Day of July 1986

[SEAL]

Attest:

DONALD J. QUIGG

Attesting Officer    Commissioner of Patents and Trademarks